United States Patent [19]

Olsen et al.

[11] 4,179,308

[45] Dec. 18, 1979

[54] LOW COST HIGH EFFICIENCY GALLIUM ARSENIDE HOMOJUNCTION SOLAR CELL INCORPORATING A LAYER OF INDIUM GALLIUM PHOSPHIDE

[75] Inventors: Gregory H. Olsen, Dayton; Michael Ettenberg, Freehold, both of N.J.

[73] Assignee: RCA Corporation, New York, N.Y.

[21] Appl. No.: 918,643

[22] Filed: Jun. 23, 1978

[51] Int. Cl.$^2$ ............................................. H01L 31/06
[52] U.S. Cl. ............................ 136/89 GA; 357/30; 357/52; 136/89 CC
[58] Field of Search .......... 136/89 SG, 89 SJ, 89 CC, 136/89 GA; 357/30, 52

[56] References Cited

U.S. PATENT DOCUMENTS

| | | | |
|---|---|---|---|
| 3,821,777 | 6/1974 | James | 357/39 |
| 3,852,591 | 12/1974 | Lee et al. | 250/211 J |
| 3,993,506 | 11/1976 | Moon | 136/89 |
| 4,017,332 | 4/1977 | James | 136/89 |
| 4,070,205 | 1/1978 | Rahilly | 136/89 SJ |

OTHER PUBLICATIONS

C. J. Nuese, "III-V Alloys For Optoelectronic Applications", *J. Electronic Mat'ls*, vol. 6, pp. 253-293 (1977).
M. S. Abrahams, "Defect Characterization In III-V Compounds", Quarterly Tech. Report No. 2, Jul. 1972, Naval Air Systems Contract NO. 0019/72/C/0145.
M. Ettenberg et al., "Interfacial Recombination Velocity Determination In $In_{0.5}Ga_{0.5}$ P/GaAs", *J. Appl. Phys.*, vol. 48, pp. 1288-1292 (1977).
L. W. James et al., "GaAs Concentrator Solar Cell", *Appl. Phys. Lett.*, vol. 26, pp. 467-470 (1975).
J. M. Woodall et al., "An Isothermal Etchback-Regrowth Method For High-Efficiency, $Ga_{1-x}Al_x$-As-GaAs Solar Cells", *Appl. Phys. Lett.*, vol. 30, pp. 492-493 (1977).
H. J. Hovel et al., "Use Of Ge Doping In Obtaining High Efficiency $Ga_{1-x}Al_xAs$-GaAs Solar Cells . . . ", *IBM Tech. Disc. Bull.*, vol. 16, pp. 854-855 (1973).
R. Sahai et al., "High Efficiency Thin Window $Ga_{1-x}Al_xAs/GaAs$ Solar Cells", Conf. Record, 12th IEEE, Photovoltaic Specialists Conf. (1976), pp. 989-992.
H. J. Hovel, "Semiconductors & Semimetals—vol. 11—Solar Cells", Academic Press (1975), pp. 83-86.

*Primary Examiner*—Aaron Weisstuch
*Attorney, Agent, or Firm*—Birgit E. Morris; A. Stephen Zavell

[57] ABSTRACT

A new low cost high efficiency gallium arsenide homojunction solar cell incorporating a passivating surface layer of indium gallium phosphide. The thickness of the indium gallium phosphide layer is selected so that it is transmissive to photons having wavelengths shorter than its bandgap energy.

7 Claims, 2 Drawing Figures

LOW COST HIGH EFFICIENCY GALLIUM ARSENIDE HOMOJUNCTION SOLAR CELL INCORPORATING A LAYER OF INDIUM GALLIUM PHOSPHIDE

This invention relates to gallium arsenide containing solar cells. More particularly, this invention relates to gallium arsenide containing solar cells incorporating a layer of indium gallium phosphide.

BACKGROUND OF THE INVENTION

The cost per watt of electricity generated directly from sunlight by photovoltaic devices, i.e., solar cells, will have to be drastically reduced before such a system is economically competitive with conventional sources of energy. Two paths to low cost generation of electricity directly from sunlight are actively being investigated: first, low efficiency but extremely low in cost solar devices such as amorphous silicon solar cells and secondly, high efficiency but more expensive solar devices fabricated from group III-V compounds, e.g., gallium arsenide (GaAs) solar cells.

Gallium arsenide solar cells which exhibit efficiencies of 18.5% to 23.0% have been fabricated by Woodall et al, J. Appl. Phys. Lett., Vol. 30, No. 9, pp. 492–493 (1977) and James et al, Appl. Phys. Lett., Vol. 26, No. 8, pp. 467–470 (1975). However, gallium arsenide solar cells require a passivating layer to increase the overall efficiency of the solar cell and reduce the surface recombination losses and lower the surface recombination velocity of the device. Gallium arsenide solar cells incorporating aluminum gallium arsenide (AlGaAs) as the passivating layer are known. However, the AlGaAs compounds with large AlAs concentrations are chemically unstable to moist ambient weather and thus the long term reliability of such solar cells is questionable. In addition, the AlGaAs passivating layer is applied by liquid phase epitaxy, a process which greatly adds to the cost of GaAs solar cells.

A compound which can be applied to the surface of GaAs by vapor phase epitaxial deposition instead of liquid phase epitaxial deposition would simplify the production process and reduce the cost of a GaAs containing solar cell. Indium gallium phosphide (InGaP) has been shown to be an effective surface passivator for gallium arsenide containing semiconductors by C. J. Nuese in J. of Electronic Materials, Vol. 6, No. 3, pp. 253–293 (1977). InGaP is inert to moist ambient weather and can be applied by vapor phase epitaxial deposition. However, the compound absorbs all photons with wavelengths shorter than about 650 nanometers. Since about 40–50% of the energy from solar radiation has wavelengths less than 650 nanometers, the absorption properties of InGaP are unacceptable for terrestrial solar cells.

Thus, it would be highly desirable to find a passivating layer for a solar cell comprising gallium arsenide which could be applied by the cost effective process of vapor phase epitaxy, exhibit resistance to ambient moisture, and be transmissive to photons with wavelengths shorter than about 650 nanometers.

SUMMARY OF THE INVENTION

A gallium arsenide solar cell incorporating a passivating surface layer of indium gallium phosphide ($In_xGa_{1-x}P$) sufficiently thin to permit the transmission of photons at wavelengths shorter than the bandgap energy of the indium gallium phosphide, i.e., wavelengths shorter than about 650 nanometers. The indium gallium phosphide is applied by vapor phase epitaxial deposition.

DETAILED DESCRIPTION OF THE INVENTION

Figure 1:
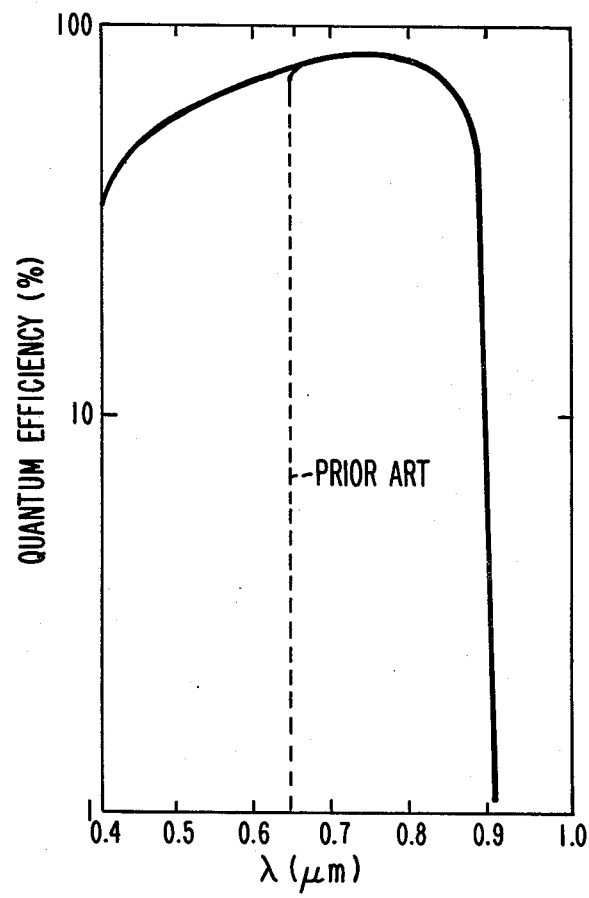
FIG. 1 is a graph of the response of a gallium arsenide electronic device with curves representing the prior art quantum efficiency of an indium gallium phosphide layer and the quantum efficiency of a gallium arsenide solar cell incorporating our indium gallium phosphide layer.

The improvement of our solar cell over prior art devices is highlighted in FIG. 1. The dashed line in FIG. 1 represents the quantum efficiency of a prior art device which absorbs photons at wavelengths below 650 nanometers. The solid line represents the quantum efficiency of a solar cell incorporating a thin InGaP layer. GaAs solar cells with InGaP layers as thin as 17.5 nanometers exhibit efficiencies between about 11.0% to 14.0%. The thin films are transmissive to photons below 650 nanometers and unexpectedly capable of reducing the surface recombination velocity from greater than about $10^6$ cm/sec. to less than about $10^4$ cm/sec., despite the teachings of M. S. Abrahams in a Naval Air Systems Command Contract #N00019/72/C/0145 that gallium films appear not to coalese below thicknesses of about 50 nanometers.

Figure 2:
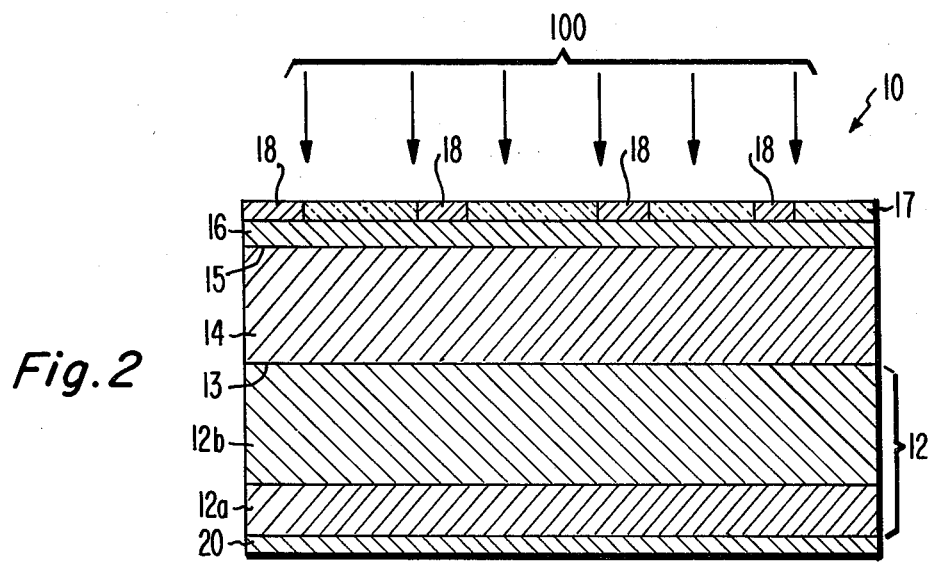
FIG. 2 is a cross-sectional view of an indium gallium phosphide/gallium arsenide solar cell according to the present invention.

FIG. 2 illustrates an indium gallium phosphide/gallium arsenide solar cell 10. Solar cell 10 includes a body 12 comprising a substrate 12a of n-type gallium arsenide about 250 microns thick grown by liquid phase epitaxy or other suitable methods known in the art and a vapor phase layer of n-type gallium arsenide 12b about 2 to about 10 $\mu$m thick. The body 12 has an n-type dopant concentration incorporating sulphur of about $1 \times 10^{18}$ atoms/cm$^3$. Alternatively, the body 12 can be p-type conductivity and subsequently deposited layers of opposite conductivity, i.e., n-type conductivity. A layer 14 of p-type gallium arsenide is grown on the body 12 of n-type gallium arsenide substrate 12 by vapor phase deposition or other methods known in the art. During the growing process the gallium arsenide is doped p-type with zinc, beryllium or other suitable p-type dopants. The layer 14 of p-type gallium arsenide deposited on the body 12 of n-type gallium arsenide forms a PN junction 13. The PN junction 13 can be either abrupt or graded.

Vapor phase epitaxial deposition is used to deposit a p-type $In_xGa_{1-x}P$ layer 16 on layer 14 of the p-type gallium arsenide, forming a heterotransition 15 therebetween. A heterotransition is defined to mean a transition from one kind of semiconductor of a given conductivity to a different kind of semiconductor of like conductivity. Although a specific indium gallium phosphide composition was required in the prior art to passivate the surface and negate the effects of lattice mismatch with gallium arsenide, see J. Electronic Materials, Vol. 6, No. 3, p. 260 (1977), we have found that x can vary from about 0.35 to about 0.62 for indium gallium phosphide films less than 50 nanometers thick without introduction of dislocations into the GaAs solar cells. Using an argon laser with a wavelength of about 514.9 nanometers, the photoluminescence intensity exhibits an increase by a factor of 70, when x varies from about 0.40 to 0.60, over solar cells without about a 20 nanometer $In_xGa_{1-x}P$ layer.

Lattice matching the $In_xGa_{1-x}P$ layer to the GaAs determines the bandgap energy of the $In_xGa_{1-x}P$ layer above which light of shorter wavelengths is absorbed. For a $In_xGa_{1-x}P$/GaAs device, this corresponds to a wavelength of about 650 nanometers. However, adjusting the thickness of the $In_xGa_{1-x}P$ layer permits the layer to be transmissive to photons with an energy above the bandgap, i.e., shorter wavelengths of light. A thickness of about 50 nanometers is transmissive to about 90% of the photons with wavelengths shorter than about 650 nanometers.

The vapor phase growth of the $In_xGa_{1-x}P$ layer can be effected by methods known in the art, but preferably is deposited according to the method of Olsen et al disclosed in copending application U.S. Ser. No. 840,039 filed Oct. 6, 1977 and incorporated herein by reference. The layer 14 of $In_xGa_{1-x}P$ is less than 50 nanometers thick, preferably between about 17.5 nanometers and about 50 nanometers and most preferably about 20 nanometers in thickness. Growth times of from about 5 to about 15 seconds according to the method of Olsen et al will produce films of the desired thickness. $In_xGa_{1-x}P$ layers thicker than about 50 nanometers exhibit reduced quantum efficiencies because of the absorption of photons having a wavelength shorter than about 650 nanometers.

An antireflection layer 17 with a thickness of from about 50 to about 200 nanometers is deposited on the $In_xGa_{1-x}P$ layer 16. $SiO_2$ formed by the thermal decomposition of silane in air at about 450° C. provides a suitable antireflection coating, although other coatings and methods known in the solar cell art can be employed.

After the formation of the antireflection coating 17 and the opening up of spaces in coating 17 by standard photolithographic techniques, the substrate 12a is lapped to a thickness of about 100 μm prior to the deposition or plating an electrode 18 of nickel and gold or other equivalent electrode materials to layer 16. The electrode 18 forms an ohmic contact to layer 16.

Electrode 20 ohmically contacts the body 12. Electrode 20 can be formed by sintering tin and thereafter, plating nickel and gold to the tin. Other suitable metal combinations known in the art that provide good ohmic contacts and are compatible with GaAs are contemplated as possible substitutes.

As an example, the process has been carried out according to the following procedure: a p-type $In_{0.5}Ga_{0.5}P$/p-type gallium arsenide/n-type gallium arsenide solar cell was grown at 700° C. by the metal chloride vapor growth technique taught by Olsen et al in Crystal Growth, Vol. 2, Edition by C. Goodman, Plenum Press (1978). Specifically, an n-type (100)−2° gallium arsenide substrate was etched in a solution of 5 parts $H_2SO_4$ to 1 part $H_2O_2$ to 1 part $H_2O$ for about 20 minutes. Thereafter, the substrate was preheated in $AsH_3$ to about 650° C. and 6 microns of n-type gallium arsenide was grown on said substrate using $H_2S$ as a dopant in a concentration sufficient to achieve an n-type dopant concentration of about $5 \times 10^{17}$ atoms/cm$^3$. An abrupt PN junction was formed by withdrawing the body of n-type gallium arsenide from the growth chamber to a prechamber for several minutes while the hydrogen sulphide was shut off and a zinc source, i.e., p-type dopant source, was heated. The body of n-type GaAs was preheated again in $AsH_3$ and a p-type GaAs layer with a dopant concentration of about $2 \times 10^{18}$ atoms/cm$^3$ was grown on the surface of the n-type GaAs to a thickness of about 3.5 μm. The GaAs was withdrawn from the prechamber and the growth chamber was prepared to grow a 20 nanometer thick p-type $In_{0.5}Ga_{0.5}P$ layer. The GaAs was preheated as described previously with respect to the deposition of the n-type gallium arsenide layer and then inserted into the deposition zone for about 8 seconds to deposit the layer of $In_{0.5}Ga_{0.5}P$. Zinc was used to dope the $In_{0.5}Ga_{0.5}P$ layer with p-type dopant concentration of $5 \times 10^{18}$ atoms/cm$^3$. $SiO_2$ was deposited on the front side of the wafer by thermal decomposition of silane in air at 450° C. until a blue color appeared. Standard photolithographic techniques were employed to remove portions of the $SiO_2$ layer. The gallium arsenide substrate was lapped to a thickness of about 100 μm. Thereafter, a nickel-gold electrode was plated in the openings in the $SiO_2$ layer and tin was sintered into the n-type GaAs side of the wafer followed by plating with nickel and gold.

Upon exposure to light of intensity Am1. the solar cell has a short circuit ($J_{sc}$) of about 17.3 MA/cm$^2$, open circuit voltage ($V_{oc}$) of about 960 mV, a fill factor (FF) of about 0.820 and an overall efficiency about 13.9%.

We claim:
1. A photovoltaic device comprising:
   a body of gallium arsenide exhibiting one type of conductivity;
   a layer of gallium arsenide of conductivity opposite to that of said body overlying and forming a PN junction with said body;
   a layer of $In_xGa_{1-x}P$ of the same conductivity type as said layer of gallium arsenide overlying and forming a heterotransition with said layer of gallium arsenide, wherein x is from about 0.35 to about 0.62 and the thickness of said layer of $In_xGa_{1-x}P$ is less than about 50 nanometers thick whereby said layer is transmissive to photons with a shorter wavelength than the bandgap wavelength of the $In_xGa_{1-x}P$; and
   means for electrically contacting said body and said layer of $In_xGa_{1-x}P$.
2. The device according to claim 1 wherein said body is of n-type conductivity.
3. The device according to claim 2 wherein x is about 0.50.
4. The device according to claim 3 wherein said layer of $In_xGa_{1-x}P$ is about 20 nanometers thick.
5. The device according to claim 1 wherein said body is of p-type conductivity.
6. The device according to claim 2 or 5 wherein said layer of $In_xGa_{1-x}P$ is from about 17.5 to less than about 50 nanometers thick.
7. The device according to claim 6 further incorporating an antireflection layer contacting said layer of $In_xGa_{1-x}P$.

* * * * *